(12) United States Patent
Shin et al.

(10) Patent No.: US 12,165,718 B2
(45) Date of Patent: Dec. 10, 2024

(54) MEMORY DEVICE AND METHOD OF OPERATING THE SAME

(71) Applicant: SK hynix Inc., Icheon-si (KR)

(72) Inventors: Hyun Seob Shin, Icheon-si (KR); Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 218 days.

(21) Appl. No.: 17/849,247

(22) Filed: Jun. 24, 2022

(65) Prior Publication Data
US 2023/0238064 A1   Jul. 27, 2023

(30) Foreign Application Priority Data

Jan. 25, 2022  (KR) .......................... 10-2022-0010803

(51) Int. Cl.
| | | |
|---|---|---|
| G11C 11/34 | (2006.01) |
| G11C 16/04 | (2006.01) |
| G11C 16/08 | (2006.01) |
| G11C 16/10 | (2006.01) |
| G11C 16/26 | (2006.01) |
| G11C 16/34 | (2006.01) |

(52) U.S. Cl.
CPC ...... G11C 16/3459 (2013.01); G11C 16/0433 (2013.01); G11C 16/08 (2013.01); G11C 16/102 (2013.01); G11C 16/26 (2013.01); G11C 16/3495 (2013.01)

(58) Field of Classification Search
CPC . G11C 16/3459; G11C 16/0433; G11C 16/08; G11C 16/102; G11C 16/26; G11C 16/3495
See application file for complete search history.

(56) References Cited

U.S. PATENT DOCUMENTS

| | | | |
|---|---|---|---|
| 11,217,318 B2* | 1/2022 | Choi .................. | G11C 16/10 |
| 2011/0051514 A1* | 3/2011 | Han .................. | G11C 16/3459 |
| | | | 365/185.09 |
| 2019/0103169 A1* | 4/2019 | Bang .................. | G11C 29/42 |
| 2022/0035570 A1* | 2/2022 | Kim .................. | G06F 3/0679 |
| 2022/0101933 A1* | 3/2022 | Choi .................. | G11C 16/08 |

(Continued)

FOREIGN PATENT DOCUMENTS

| | | |
|---|---|---|
| KR | 1020060021097 A | 3/2006 |
| KR | 1020210027783 A | 3/2021 |

*Primary Examiner* — Viet Q Nguyen
(74) *Attorney, Agent, or Firm* — WILLIAM PARK & ASSOCIATES LTD.

(57) ABSTRACT

Provided herein may be a memory device and a method of operating the same. The memory device may include a plurality of memory cells, a program operation performer configured to perform a plurality of program loops on the plurality of memory cells, a step voltage calculator configured to calculate a step voltage, the step voltage being a difference of magnitude between program voltages that are applied in any two consecutive program loops, a reference bit determiner configured to determine a reference number of fail bits based on a magnitude of the step voltage, and a verification result generator configured to generate verification result information based on a result of a comparison between the reference number of fail bits and a number of on-cells, among the plurality of memory cells, identified in a verify operation that is included in a program loop, among the plurality of program loops.

18 Claims, 15 Drawing Sheets

(56) References Cited

U.S. PATENT DOCUMENTS

2023/0040560 A1\* 2/2023 Kim .................... G11C 11/5628
2023/0046005 A1\* 2/2023 Choi ...................... G11C 16/08
2023/0071618 A1\* 3/2023 Shin ....................... G11C 16/10

\* cited by examiner

| PL | Vpgm |
|----|------|
| PL1 | Vpgm1 |
| PL2 | Vpgm2 |
| PL3 | Vpgm3 |
| PL4 | Vpgm4 |
| ⋮ | ⋮ |
| PLn | Vpgmn |

Table1

| Vstep1 | Ref fb1 |
|---|---|
| 400<Vstep≤450 | 50 |
| 450<Vstep≤500 | 50+a |
| 500<Vstep≤550 | 50+2a |
| 550<Vstep≤600 | 50+3a |
| 600<Vstep≤650 | 50+4a |
| ⋮ | ⋮ |

Table2

| Vstep2 | Ref fb11 |
|---|---|
| 400 | 50 |
| 450 | 50+a |
| 500 | 50+2a |
| 550 | 50+3a |
| 600 | 50+4a |
| ⋮ | ⋮ |

FIG. 10

Table3

| E/W Cnt | E/W Cnt<Ref Cnt1 | Ref Cnt1≤E/W Cnt<Ref Cnt2 | Ref Cnt2≤E/W Cnt<Ref Cnt3 | ... |
|---|---|---|---|---|
| Ref fb2 | 0 | b | 2b | ... |

Table4    171

| WL | Ref fb3 |
|---|---|
| ⋮ | ⋮ |
| WL6 | -2c |
| WL7 | -c |
| WL8 | 0 |
| WL9 | -c |
| WL10 | -2c |
| ⋮ | ⋮ |

| Table1 or 2 | Table3 | Table4 | Ref fb |
|---|---|---|---|
| 50+2a | b | -c | 50+2a+b-c |

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0010803 filed on Jan. 25, 2022, in the Korean Intellectual Property Office, the entire disclosure of which is incorporated by reference herein.

BACKGROUND

1. Technical Field

Various embodiments of the present disclosure relate to an electronic device, and more particularly to a memory device and a method of operating the memory device.

2. Related Art

Memory devices are storage devices implemented using a semiconductor such as silicon (Si), germanium (Ge), gallium arsenide (GaAs), or indium phosphide (InP). Memory devices are basically classified into a volatile memory device and a nonvolatile memory device.

The volatile memory device is a memory device in which stored data is lost when power supply is interrupted. Representative examples of the volatile memory device include a static random access memory (SRAM), a dynamic RAM (DRAM), and a synchronous DRAM (SDRAM). The nonvolatile memory device is a memory device in which stored data is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). The flash memory is basically classified into a NOR type and a NAND type.

SUMMARY

An embodiment of the present disclosure may provide for a memory device. The memory device may include a plurality of memory cells, a program operation performer configured to perform a plurality of program loops on the plurality of memory cells, a step voltage calculator configured to calculate a step voltage, the step voltage being a difference of magnitude between program voltages that are applied in any two consecutive program loops, among the plurality of program loops, a reference bit determiner configured to determine a reference number of fail bits based on a magnitude of the step voltage, and a verification result generator configured to generate verification result information based on a result of a comparison between the reference number of fail bits and a number of on-cells, among the plurality of memory cells, identified in a verify operation that is included in a program loop, among the plurality of program loops.

An embodiment of the present disclosure may provide for a method of operating a memory device including a plurality of memory cells. The method may include performing a plurality of program loops on the plurality of memory cells, calculating a step voltage, the step voltage being a difference of magnitude between program voltages that are applied in any two consecutive program loops, among the plurality of program loops, determining a reference number of fail bits based on a magnitude of the step voltage, and generating verification result information based on a result of a comparison between the reference number of fail bits and a number of on-cells, among the plurality of memory cells, identified in a verify operation that is included in a program loop, among the plurality of program loops.

An embodiment of the present disclosure may provide for a memory device. The memory device may include a plurality of memory cells, a program operation performer configured to perform a plurality of program loops on the plurality of memory cells, a verification result generator configured to generate verification result information based on a result of comparing a reference number of fail bits to a number of on-cells, among the plurality of memory cells, identified in a verify operation that is included in each of the plurality of program loops, wherein a magnitude of the program voltage that is used in each of the plurality of program loops increases by a step voltage for each subsequent program loop, among the plurality of program loops, and the reference number of fail bits has a larger number of bits as a magnitude of the step voltage increases.

BRIEF DESCRIPTION OF THE DRAWINGS

FIG. 8 is a diagram illustrating a program voltage information storage.

FIG. 9 is a diagram illustrating the first reference number of bits that corresponds to the magnitude of a step voltage.

FIG. 10 is a diagram illustrating the second reference number of bits that corresponds to the number of program and erase operations.

FIG. 11 is a diagram illustrating the third reference number of bits that corresponds to the location of a word line.

FIG. 12 is a diagram illustrating the reference number of fail bits determined in consideration of the magnitude of a step voltage, the number of program and erase operations, and the location of a word line.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms and should not be construed as being limited to the embodiments described in the specification or application.

Figure 1:
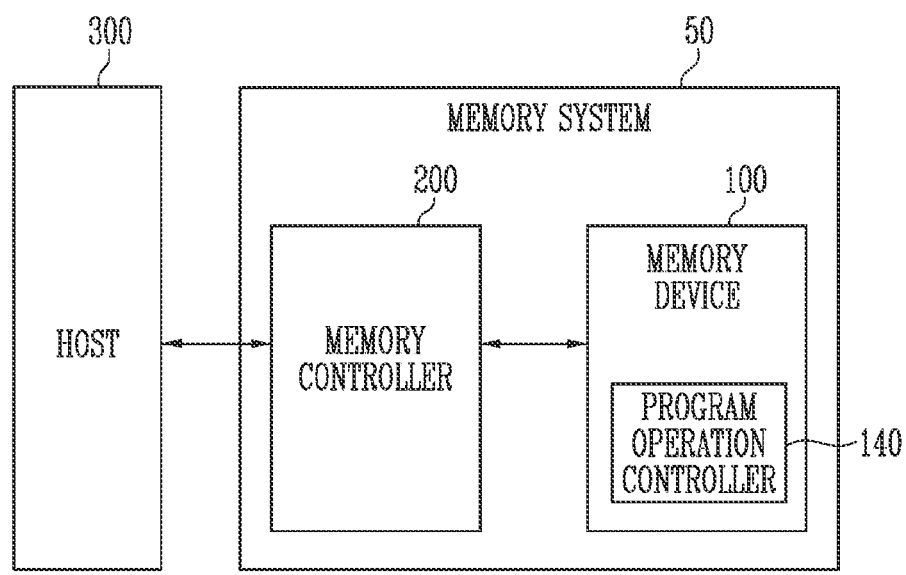
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device which stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any one of various types of storage devices based on the host interface as the means for communicating with the host 300. For example, the memory system 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of the various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated in response to the control of the memory controller 200. The memory device 100 may include a memory cell array (not illustrated) including a plurality of memory cells that store data.

Each of the plurality of memory cells may be implemented as a single-level cell (SLC) that is capable of storing one bit of data, a multi-level cell (MLC) that is capable of storing two bits of data, a triple-level cell (TLC) that is capable of storing three bits of data, or a quad-level cell (QLC) that is capable of storing four bits of data.

The memory cell array (not illustrated) may include a plurality of memory blocks. Each memory block may include a plurality of memory cells. A single memory block may include a plurality of pages. In an embodiment, a page may be a unit by which data is stored in the memory device 100 or by which data that is stored in the memory device 100 is read. A memory block may be a unit by which data is erased.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change RAM (PRAM), a magnetoresistive RAM (MRAM), a ferroelectric RAM (FRAM), or a spin transfer torque RAM (STT-RAM). In the present specification, for convenience of description, it is assumed that the memory device 100 is a NAND flash memory.

The memory device 100 may receive a command and an address from the memory controller 200 and may access the area of the memory cell array that is selected by the address. The memory device 100 may perform an operation that is indicated by the command on the area that is selected by the address. For example, the memory device 100 may perform a write operation (i.e., a program operation), a read operation, and an erase operation. During a write operation, the memory device 100 may program data to the area that is selected by the address. During a read operation, the memory device 100 may read data from the area that is selected by the address. During an erase operation, the memory device 100 may erase data that is stored in the area that is selected by the address.

In an embodiment, a program operation may include a plurality of program loops. Each program loop may include a program voltage apply operation and a verify operation. The program voltage apply operation may be an operation of increasing threshold voltages of the plurality of memory cells by using a program voltage. The verify operation may be an operation of identifying whether the threshold voltage of each memory cell has reached a threshold voltage that corresponds to a target program state. In an embodiment, the verify operation may be performed for each of the plurality of program states. A verify operation for all program states may be performed in each program loop, or alternatively, verify operations for all program states may be performed only in preset program loops. In other embodiments, a program state that corresponds to the verify operation to be performed in each program loop may be preset.

In detail, the verify operation may be an operation of identifying whether the threshold voltages of the plurality of memory cells are greater than a verify voltage. For example, the plurality of memory cells having threshold voltages greater than the verify voltage in the verify operation may be identified as "off-cells." An off-cell may be represented by a logic value of "0." The threshold voltages of the plurality of memory cells identified as "off-cells" in the verify operation may be determined to have reached threshold voltages that correspond to the target program state. On the other hand, during the verify operation, the plurality of memory cells having threshold voltages less than or equal to the verify voltage may be identified as "on-cells." An on-cell may be represented by a logic value of "1." The threshold voltages of the plurality of memory cells identified as "on-cells" in the verify operation may be determined not to have reached threshold voltages that correspond to the target program states.

The result of performing the verify operation may indicate a 'verify pass' or a 'verify fail.' A verify pass may indicate the case in which the number of memory cells that are identified as on-cells is less than the reference number of fail bits. A verify fail may indicate the case in which the number of memory cells that are identified as on-cells is equal to or greater than the reference number of fail bits. That is, the reference number of fail bits may be the reference number of bits that is used to determine which one of 'verify pass' and 'verify fail' corresponds to the result of the verify operation.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) that controls communication with the host 300, a flash translation layer (FTL) that controls communication between the host 300 and the memory device 100, and a flash interface layer (FIL) that controls communication with the memory device 100.

In an embodiment, the memory controller 200 may receive data and a logical block address (LBA) from the host 300 and may translate the logical block address (LBA) into a physical block address (PBA) indicating the address of the plurality of memory cells that are included in the memory device 100 and in which data is to be stored. In the present specification, the terms "logical block address (LBA)" and "logical address" may be used interchangeably. In the present specification, the terms "physical block address (PBA)" and "physical address" may be used interchangeably.

The memory controller 200 may control the memory device 100 so that a write operation, a read operation, or an erase operation is performed in response to a request that is received from the host 300. During a write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data regardless of whether a request from the host 300 is received and may transmit them to the memory device 100. For example, the memory controller 200 may provide the memory device 100 with commands, addresses, and data required to perform read operations and write operations that are involved in performing wear leveling, read reclaim, garbage collection, etc.

In an embodiment, the memory controller 200 may control at least two memory devices 100. In this case, the memory controller 200 may control the memory devices 100 based on an interleaving scheme to improve operating performance. The interleaving scheme may be a scheme for controlling the memory devices 100 so that the operations of at least two memory devices 100 are caused to overlap each other.

The host 300 may communicate with the memory system 50 using at least one of various communication methods, such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
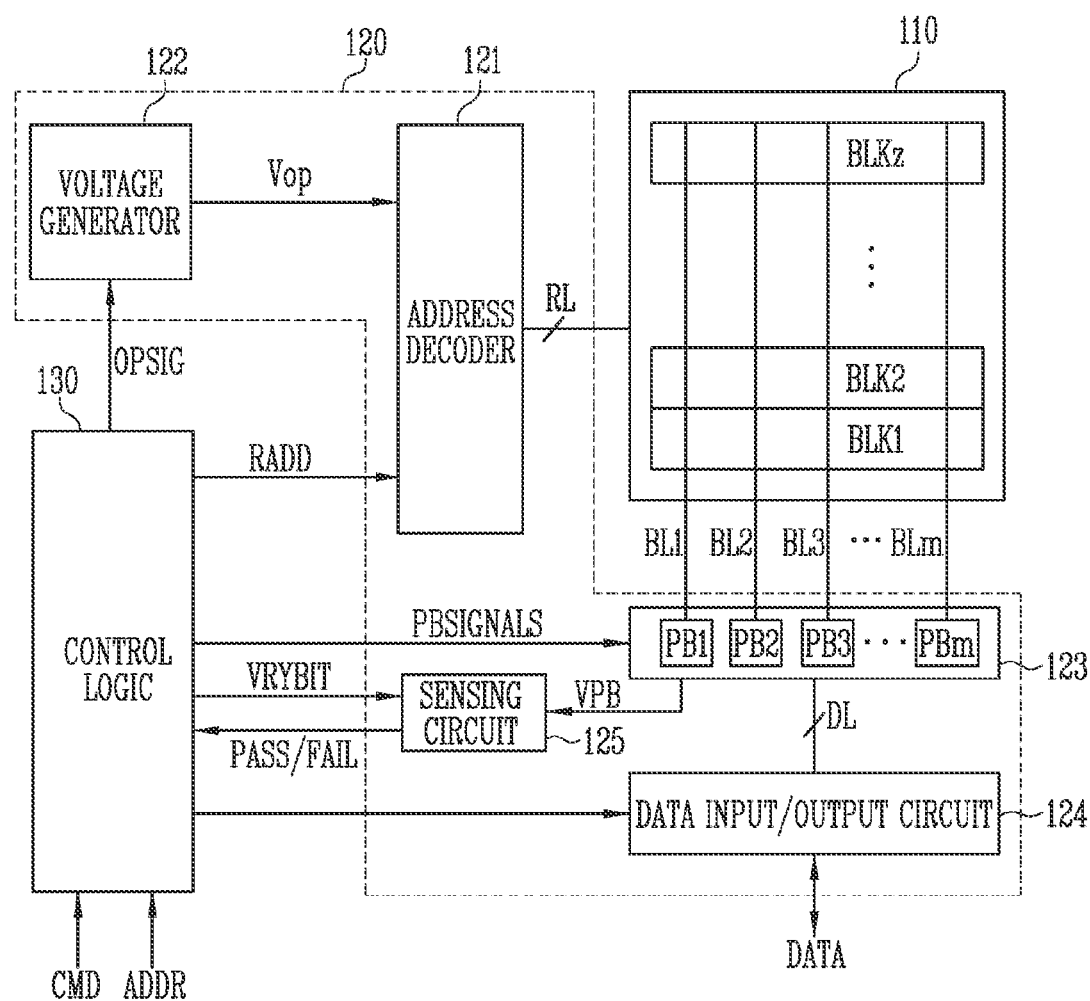
FIG. 2 is a diagram illustrating the structure of the memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz may be coupled to an address decoder 121 through row lines RL. The memory blocks BLK1 to BLKz are coupled to a page buffer group 123 through bit lines BL1 to BLm. Each of the memory blocks BLK1 to BLKz may include a plurality of memory cells. In an embodiment, the plurality of memory cells may be nonvolatile memory cells. The plurality of memory cells that are coupled to the same word line among the plurality of memory cells are defined as one page. In other words, the memory cell array 110 may include a plurality of pages. In an embodiment of the present disclosure, each of the memory blocks BLK1 to BLKz included in the memory cell array 110 may include a plurality of dummy cells. For the dummy cells, one or more dummy cells may be coupled in series between a drain select transistor and the plurality of memory cells and between a source select transistor and the plurality of memory cells.

Each of the plurality of memory cells of the memory device 100 may be implemented as a single-level cell (SLC) that is capable of storing one bit of data, a multi-level cell (MLC) that is capable of storing two bits of data, a triple-level cell (TLC) that is capable of storing three bits of data, or a quad-level cell (QLC) that is capable of storing four bits of data.

The peripheral circuit 120 may drive the memory cell array 110. In an example, the peripheral circuit 120 may drive the memory cell array 110 so that a program operation, a read operation, and an erase operation are performed under the control of the control logic 130. In other examples, the peripheral circuit 120 may apply various operating voltages to the row lines RL and the bit lines BL1 to BLm or discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment, the row lines RL may further include a pipe select line.

The address decoder 121 may be operated under the control of the control logic 130. The address decoder 121 receives addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to unselected word lines.

During a read operation, the address decoder 121 may apply a read voltage to the selected word line and apply a read pass voltage having a level higher than that of the read voltage to unselected word lines.

The erase operation of the memory device 100 is performed on a memory block basis. During the erase operation, the addresses ADDR input to the memory device 100 include a block address. The address decoder 121 may decode the block address and select one memory block according to the decoded block address. During the erase operation, the address decoder 121 may apply a ground voltage to word lines coupled to the selected memory block.

The address decoder 121 may decode a column address, among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 may be used as an operating voltage for the memory device 100.

In an embodiment, the voltage generator 122 may generate various operating voltages Vop that are used for program, read, and erase operations in response to an operation signal OPSIG. The voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage to generate a plurality of operating voltages Vop having various voltage levels and may generate the plurality of operating voltages Vop by selectively enabling the plurality of pumping capacitors under the control of the control logic 130.

The generated operating voltages Vop may be supplied to the memory cell array 110 by the address decoder 121.

The page buffer group 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm may transmit/receive data DATA to/from the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. The plurality of memory cells in the selected page may be programmed based on the received data DATA. The plurality of memory cells that are coupled to a bit line to which a program-enable voltage (e.g., a ground voltage) is applied may have increased threshold voltages. The threshold voltages of the plurality of memory cells that are coupled to a bit line to which a program-inhibit voltage (e.g., a supply voltage) is applied may be maintained. During a program verify operation, the first to m-th page buffers PB1 to PBm read the data DATA that is stored in the selected memory cells from the selected memory cells through the bit lines BL1 to BLm.

During a read operation, the page buffer group 123 may read data DATA from the plurality of memory cells in the selected page through the bit lines BL1 to BLm and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data that are stored in some of the plurality of page buffers that are included in the page buffer group 123 are being programmed to the memory cell array 110, the remaining page buffers may receive new data from the memory controller 200 and then store the new data.

The data input/output circuit 124 may be coupled to the first to m-th page buffers PB1 to PBm through the data lines DL. The data input/output circuit 124 may be operated in response to the control of the control logic 130.

The data input/output circuit 124 may include a plurality of input/output buffers (not illustrated) that receive input data DATA. During a program operation, the data input/output circuit 124 may receive the data DATA to be stored from an external controller (not illustrated). During a read operation, the data input/output circuit 124 may output the data DATA, received from the first to m-th page buffers PB1 to PBm included in the page buffer group 123, to the external controller.

During a read operation or a verify operation, the sensing circuit 125 may generate a reference current in response to an enable bit signal VRYBIT that is generated by the control logic 130 and may output a pass signal or a fail signal to the control logic 130 by comparing a sensing voltage VPB that is received from the page buffer group 123 with a reference voltage generated by the reference current. The enable bit signal VRYBIT may be the reference number of fail bits. The magnitude of the sensing voltage VPB may be changed based on the number of memory cells that are identified as on-cells. Alternatively, the magnitude of the sensing voltage VPB may be changed based on the number of memory cells that are identified as off-cells. In an embodiment, the sensing circuit 125 may generate a reference voltage based on the reference number of fail bits, compare the reference voltage to the sensing voltage VPB that is determined based on the number of memory cells identified as on-cells, and then output a pass signal or a fail signal to the control logic 130. In an example, the sensing circuit 125 may output a pass signal to the control logic 130 when the magnitude of the sensing voltage VPB is less than that of the reference voltage. In another example, the sensing circuit 125 may output a fail signal to the control logic 130 when the magnitude of the sensing voltage VPB is less than that of the reference voltage.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD that is transferred from an external device.

The control logic 130 may control the peripheral circuit 120 by generating various types of signals in response to the command CMD and the addresses ADDR. For example, the control logic 130 may generate the operation signal OPSIG, the row address RADD, page buffer control signals PBSIG-NALS, and the enable bit signal VRYBIT in response to the command CMD and the addresses ADDR. The control logic 130 may output the operation signal OPSIG to the voltage generator 122, output the row address RADD to the address decoder 121, output the page buffer control signal PBSIG-NALS to the page buffer group 123, and output the enable bit signal VRYBIT to the sensing circuit 125. In addition, the control logic 130 may determine whether a verify operation has passed or failed in response to the pass or fail signal PASS or FAIL output from the sensing circuit 125.

The program operation controller 140 illustrated in FIG. 1 may is be included in the memory device 100 illustrated in FIG. 2. The program operation controller 140 may control a program operation performed on the plurality of memory cells. The program operation controller 140 may include the peripheral circuit 120 and the memory cell array 110. The program operation controller 140 may drive the memory cell array 110 to perform a program operation. The program operation controller 140 may control the peripheral circuit 120 so that operating voltages to be used in the program operation are applied to the row lines RL and the bit lines BL1 to BLm.

The program operation controller 140, illustrated in FIG. 1, may include the page buffer group 123 and the sensing circuit 125. The program operation controller 140 may determine the magnitude of the sensing voltage VPB based on the number of memory cells that are identified as on-cells during a verify operation. The program operation controller 140 may generate a reference voltage based on the reference number of fail bits. The program operation controller 140 may determine a verify pass or a verify fail by comparing the magnitude of the reference voltage with the magnitude of the sensing voltage VPB. The program operation controller 140 may determine whether a program loop is to be performed based on the result of performing the verify operation.

Figure 3:
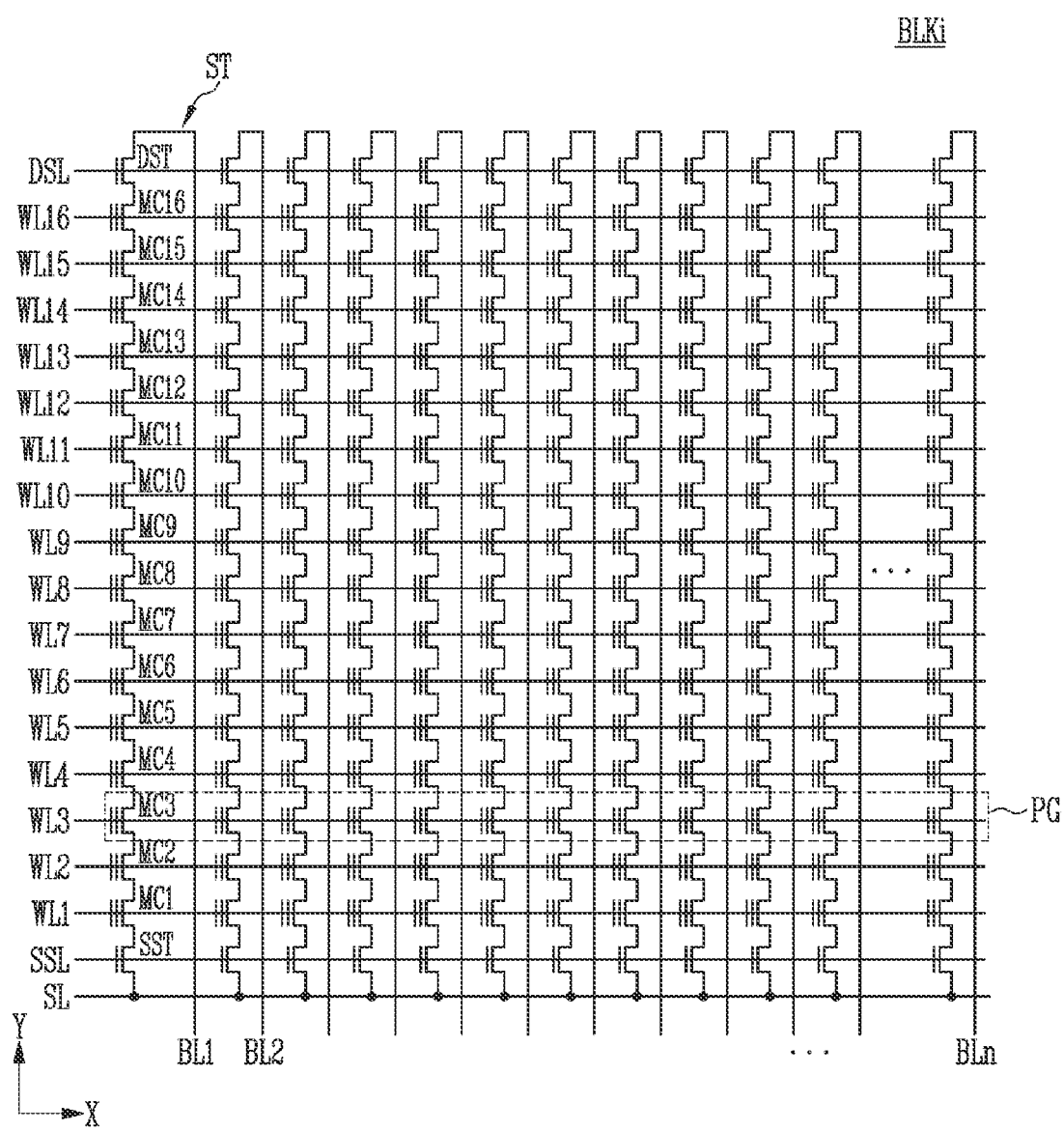
FIG. 3 is a diagram illustrating the structure of any one of a plurality of memory blocks BLK1 to BLKz of FIG. 2.

FIG. 3 is a diagram illustrating the structure of any one of the plurality of memory blocks BLK1 to BLKz of FIG. 2.

A memory block BLKi indicates any one memory block BLKi, among the memory blocks BLK1 to BLKz illustrated in FIG. 2.

Referring to FIG. 3, a plurality of word lines that are arranged in parallel to each other may be coupled between a first select line and a second select line. Here, the first select line may be a source select line SSL, and the second select line may be a drain select line DSL. In detail, the memory block BLKi may include a plurality of strings ST that are coupled between bit lines BL1 to BLn and a source line SL. The bit lines BL1 to BLn may be coupled to the strings ST, respectively, and the source line SL may be coupled in common to the strings ST. The strings ST may be equally configured, and thus, the string ST that is coupled to the first bit line BL1 will be described in detail by way of example.

The string ST may include a source select transistor SST, a plurality of memory cells MC1 to MC16, and a drain select transistor DST that are coupled, in series, between the source line SL and the first bit line BL1. A single string ST may include at least one source select transistor SST and at least one drain select transistor DST and may include more memory cells than the plurality of memory cells MC1 to MC16, illustrated in the drawing.

A source of the source select transistor SST may be coupled to the source line SL, and a drain of the drain select transistor DST may be coupled to the first bit line BL1. The plurality of memory cells MC1 to MC16 may be coupled, in series, between the source select transistor SST and the drain select transistor DST. Gates of the source select transistors SST that are included in different strings ST may be coupled to the source select line SSL, gates of the drain select transistors DST that are included in different strings ST may be coupled to the drain select line DSL, and gates of the plurality of memory cells MC1 to MC16 may be coupled to a plurality of word lines WL1 to WL16, respectively. A group of memory cells, among the plurality of memory cells that are included in different strings ST but coupled to the same word line, may be referred to as a 'physical page (PG)'. Therefore, the memory block BLKi may include the same number of physical pages (PG) as the number of word lines WL1 to WL16.

One memory cell may store one bit of data. This cell is typically designated as a "single-level cell (SLC)". In this case, one physical page (PG) may store data that corresponds to one logical page (LPG). The data that corresponds to one logical page (LPG) may include the same number of data bits as the number of cells that are included in one physical page (PG).

One memory cell may store two or more bits of data. In this case, one physical page (PG) may store data that corresponds to two or more logical pages (LPG).

Figure 4:
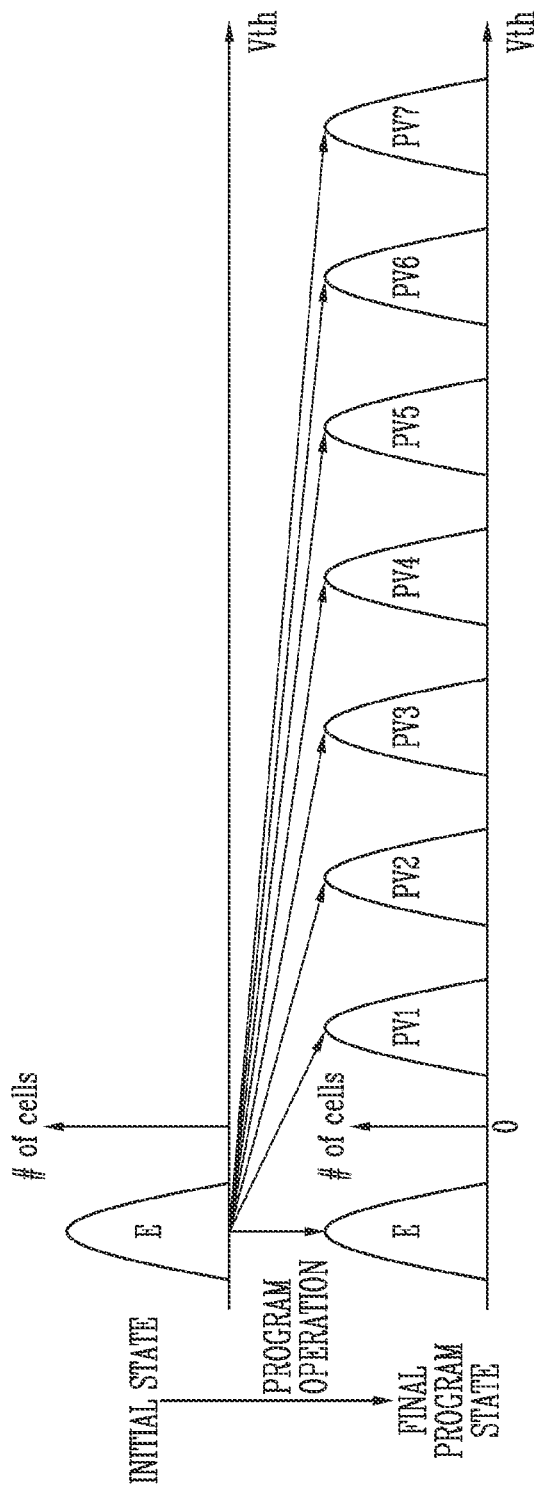
FIG. 4 is a diagram illustrating threshold voltage distributions of a plurality of memory cells based on a program operation of a memory device.

FIG. 4 is a diagram illustrating threshold voltage distributions of a plurality of memory cells based on a program operation of a memory device.

In FIG. 4, the horizontal axis of a graph indicates threshold voltages Vth of the plurality of memory cells, and the vertical axis of the graph indicates the number of memory cells (# of cells).

Referring to FIG. 4, the threshold voltage distributions of the plurality of memory cells may be changed from an initial state to a final program state based on the program operation.

In FIG. 4, a description is made on the assumption that data is programmed using a TLC scheme in which one memory cell stores three bits of data.

The initial state may be a state in which a program operation is not performed and in which the threshold voltage distributions of the plurality of memory cells are in an erase state E.

The final program state may be the threshold voltage distribution of the plurality of memory cells on which a program operation is performed. Each of the plurality of memory cells on which the program operation is performed may have a threshold voltage that corresponds to any one of a plurality of program states. For example, when data is programmed in a triple-level cell (TLC) scheme in which three bits of data are stored in one memory cell, the plurality of program states may indicate the erased state E and first to seventh program states PV1 to PV7. In an embodiment, each of the plurality of memory cells on which the program operation is performed may have a threshold voltage that corresponds to the erased state E or any one of the first to seventh program states PV1 to PV7. The threshold voltage of each memory cell in the initial state may be increased to the threshold voltage that corresponds to the erased state E or any one of the first to seventh program states PV1 to PV7 through the program operation.

Each memory cell may have the erased state E or any one of the program states PV1 to PV7 as a target program state. The target program state may be determined based on the data to be stored in the corresponding memory cell. The plurality of memory cells may have threshold voltages that correspond to the target program state, among the final program states, through respective program operations.

Figure 5:
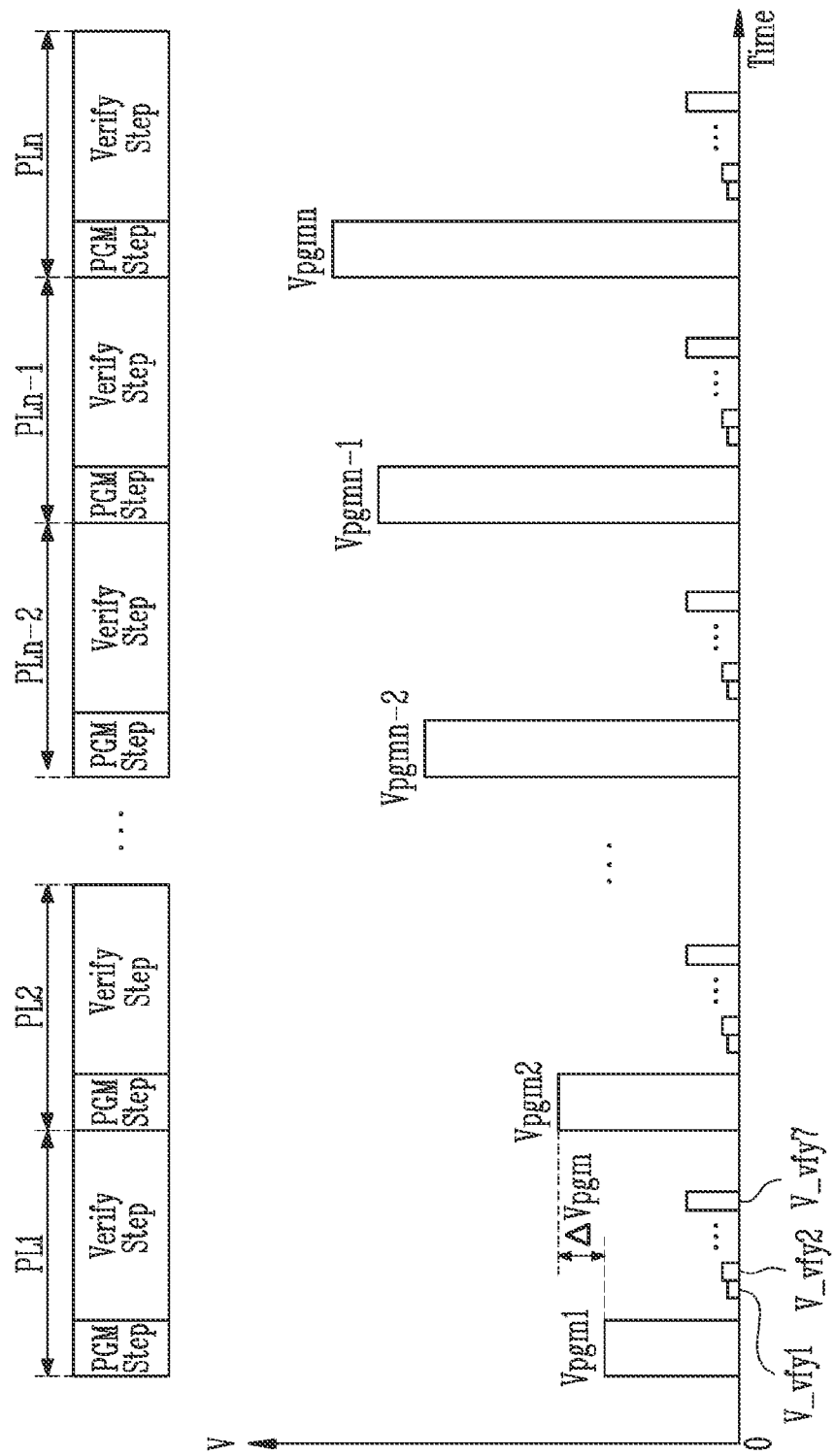
FIG. 5 is a diagram illustrating the program operation of the memory device.

FIG. 5 is a diagram illustrating the program operation of the memory device.

In FIG. 5, the horizontal axis of a graph indicates time, and the vertical axis thereof indicates voltage V that is applied to word lines. The voltage V that is applied to the word lines may include a program voltage Vpgm and a verify voltage V_vfy.

In FIG. 5, it is assumed that data is programmed by using the TLC scheme in which one memory cell stores three bits of data. However, the scope of the present disclosure is not limited thereto, and a single memory cell may be programmed to store two bits of data or to store four or more bits of data.

Referring to FIG. 5, the program operation of the memory device 100 may include a plurality of program loops PL1 to PLn. The memory device 100 may perform a program operation so that each of selected memory cells that is coupled to a selected word line has a threshold voltage that corresponds to any one of a plurality of program states by performing the plurality of program loops PL1 to PLn. For example, when a single memory cell is programmed in a TLC scheme, the memory device 100 may perform a program operation so that the memory cell has a threshold voltage that corresponds to any one of an erased state E and first to seventh program states PV1 to PV7 by performing the plurality of program loops PL1 to PLn.

Each of the plurality of program loops PL1 to PLn may include a program voltage apply operation (PGM Step) and a verify operation (Verify Step).

The program voltage apply operation (PGM Step) may be an operation of applying a program voltage to a selected word line that is coupled to the selected memory cells. For example, the memory device 100 may apply a first program voltage Vpgm1 to the selected word line that is coupled to selected memory cells in the first program loop PL1. After the first program voltage Vpgm1 is applied to the selected word line, respective threshold voltages of the selected memory cells may be the threshold voltages that correspond to target program states, among the plurality of program states.

The verify operation (Verify Step) may be an operation of applying a verify voltage to the selected word line that is coupled to the selected memory cells. The verify operation (Verify step) may be an operation of determining whether respective threshold voltages of the selected memory cells are threshold voltages that correspond to the target program states, among the plurality of program states. The verify operation (Verify Step) may be an operation of applying verify voltages that correspond to respective target program states of the selected memory cells.

In an embodiment, in the first program loop PL1, after the first program voltage Vpgm1 is applied to the selected word line that is coupled to the selected memory cells, the memory device 100 may apply first to seventh verify voltages V_vfy1 to V_vfy7 to the selected word line. In this case, the verify operation (Verify Step) may be performed on the plurality of memory cells having a first program state as the target program state by using the first verify voltage V_vfy1. The verify operation (Verify Step) may be performed on the plurality of memory cells having a second program state as the target program state by using the second verify voltage V_vfy2. The verify operation (Verify Step) may be performed on the plurality of memory cells having a third program state as the target program state by using the third verify voltage V_vfy3. The verify operation (Verify Step) may be performed on the plurality of memory cells having a fourth program state as the target program state by using the fourth verify voltage V_vfy4. The verify operation (Verify Step) may be performed on the plurality of memory cells having a fifth program state as the target program state by using the fifth verify voltage V_vfy5. The verify operation (Verify Step) may be performed on the plurality of memory cells having a sixth program state as the target program state by using the sixth verify voltage V_vfy6. The verify operation (Verify Step) may be performed on the plurality of memory cells having a seventh program state as the target program state by using the seventh verify voltage V_vfy7. The magnitudes of the verify voltages V_vfy1 to V_vfy7 may increase in the direction from the first verify voltage V_vfy1 to the seventh verify voltage V_vfy7. In detail, for the magnitudes of the verify voltages V_vfy1 to V_vfy7, the first verify voltage V_vfy1 may be the lowest, and the seventh verify voltage V_vfy7 may be the highest. However, the number of verify voltages is not limited to the present embodiment.

It may be determined that the plurality of memory cells having passed the verify operation (verify step) by using respective verify voltages V_vfy1 to V_vfy7 have threshold voltages that correspond to the target program states. The plurality of memory cells having passed the verify operation (Verify Step) may be program-inhibited in the second program loop PL2. A program-inhibit voltage may be applied to bit lines that are coupled to the program-inhibited memory cells.

It may be determined that the plurality of memory cells having failed at the verify step by using respective verify voltages V_vfy1 to V_vfy7 do not have threshold voltages that correspond to the target program states. The plurality of memory cells having failed at the verify step may perform the second program loop PL2.

In the second program loop PL2, the memory device 100 may apply a second program voltage Vpgm2, higher than the first program voltage Vpgm1 by a unit voltage ΔVpgm, to a selected word line that is coupled to selected memory cells. Thereafter, the memory device 100 may perform the verify operation (Verify Step) of the second program loop PL2 in the same manner as the verify operation (Verify Step) of the first program loop PL1.

Thereafter, the memory device 100 may perform a subsequent program loop in the same manner as the second program loop PL2 a preset number of times.

In an embodiment, when the program operation is not completed within a preset number of program loops, the program operation may fail. When the program operation is completed within a preset number of program loops, the program operation may pass. Whether the program operation is completed may be determined based on whether all the selected memory cells have passed the verify operation (Verify Step). When all the selected memory cells have passed the verify operation (Verify Step), a subsequent program loop might not be performed.

In an embodiment, the program voltage may be determined based on an incremental step pulse programming (ISPP) method. The level of the program voltage may be increased or decreased by stages (i.e., by a step voltage) as the plurality of program loops PL1 to PLn are repeated. In other words, the step voltage may be a difference of magnitude between program voltages that are applied in any two consecutive program loops, among the plurality of program loops PL1 to PLn. The number of applications of program voltages that are used in each program loop, the voltage levels of the program voltages, voltage apply times, etc. may be determined in various forms under the control of the memory controller 200.

Figure 6:
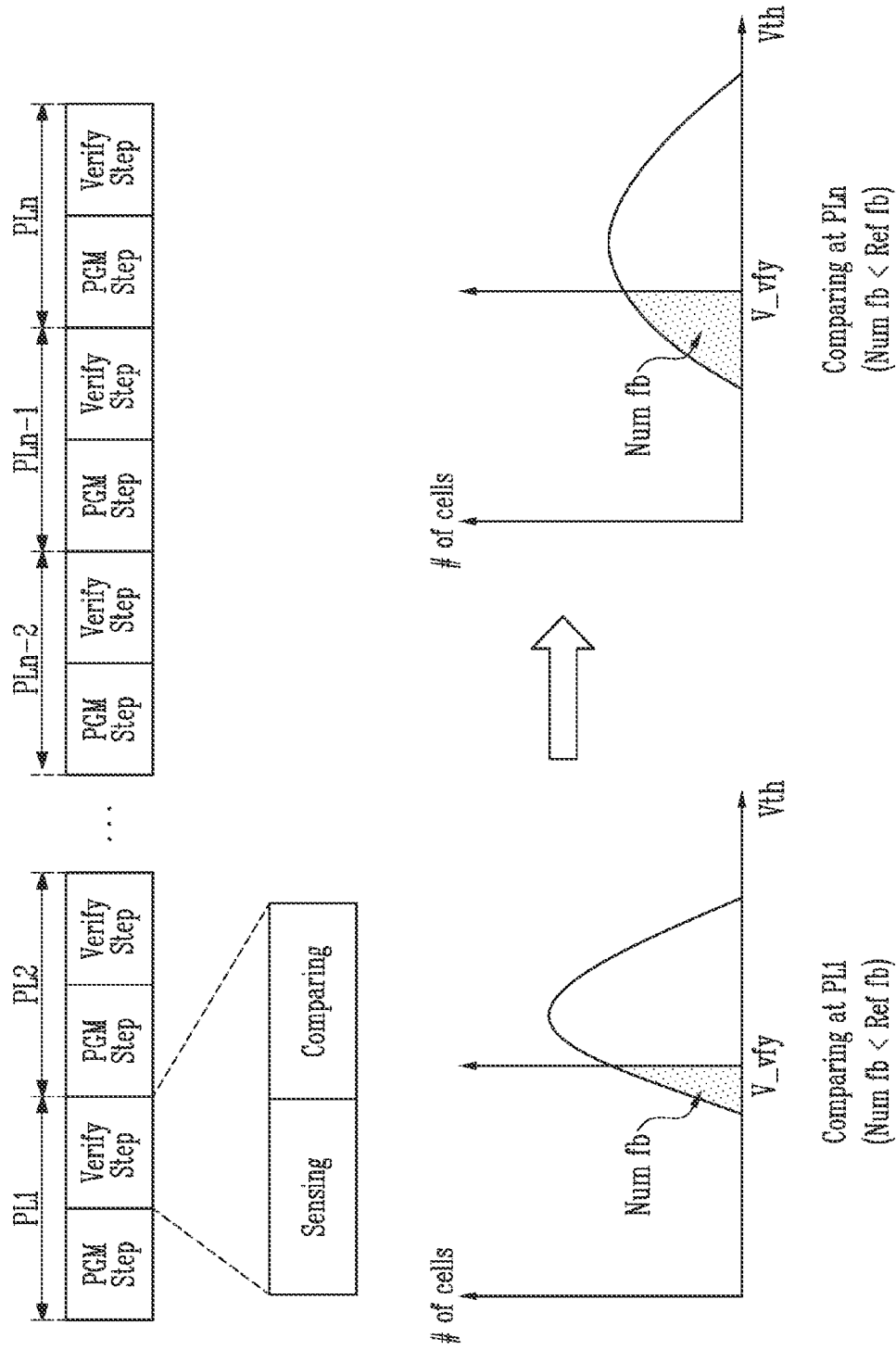
FIG. 6 is a diagram illustrating a verify operation in the program operation of the memory device.

FIG. 6 is a diagram illustrating a verify operation in the program operation of the memory device.

Referring to FIG. 6, the program operation of the memory device 100 may include a plurality of program loops PL1 to PLn. Each of the plurality of program loops PL1 to PLn may include a program voltage apply operation (PGM Step) and a verify operation (Verify Step). The verify operation (Verify Step) may include a sensing period (Sensing) and a comparing period (Comparing).

The sensing period (Sensing) may be a period in which, when a verify voltage is applied to a selected word line that is coupled to selected memory cells, the voltage of a bit line, which varies based on the threshold voltages of the selected memory cells, is sensed. The memory device 100 may identify the threshold voltages of the selected memory cells based on the varying voltage of the bit line. In an example, when the threshold voltage of a certain memory cell is greater than the verify voltage, the voltage of the bit line that is coupled to the memory cell may be maintained. Here, a memory cell having a threshold voltage that is greater than the verify voltage may be identified as an off-cell. The threshold voltage of the memory cell that is identified as an "off-cell" may be determined to have reached a threshold voltage that corresponds to a target program state. On the other hand, when the threshold voltage of a certain memory cell is less than or equal to the verify voltage, the voltage of the bit line that is coupled to the memory cell may be decreased. Here, a memory cell having a threshold voltage less than or equal to the verify voltage may be identified as an "on-cell." The threshold voltage of the memory cell that is identified as an "on-cell" may be determined not to have reached a threshold voltage that corresponds to a target program state.

The comparing period may be a period in which the number of memory cells that are identified as on-cells is compared with the reference number of fail bits. The reference number of fail bits may be the reference number of bits that is used to determine which one of 'verify pass' and 'verify fail' corresponds to the result of the verify operation (Verify Step).

The graphs illustrated in the lower portion of FIG. 6 show the threshold voltage distributions of the plurality of memory cells, which varies as the memory device 100 performs a plurality of program loops PL1 to PLn. Further, the horizontal axis of the graphs illustrated in the lower portion of FIG. 6 indicates threshold voltages Vth of the plurality of memory cells and the vertical axis thereof indicates the number of memory cells (# of cells).

Referring to the graphs in the lower portion of FIG. 6, each of the plurality of program loops PLi to PLn may include a comparing period (Comparing). During the comparing period of each of the plurality of program loops PLi to PLn, the memory device 100 may compare the number of memory cells Num fb that are identified as on-cells by using a verify voltage V_vfy with the reference number of fail bits Ref fb. In an example, when the number of memory cells Num fb that are identified as on-cells by using the verify voltage V_vfy is less than the reference number of fail bits Ref fb, the verify operation (Verify Step) may pass. In another example, when the number of memory cells Num fb that are identified as on-cells by using the verify voltage V_vfy is equal to or greater than the reference number of fail bits Ref fb, the verify operation (Verify Step) may fail.

However, during the program voltage apply operation (PGM Step), the extents to which the threshold voltages of respective memory cells increase may differ from each other. For example, the threshold voltage of any one of the plurality of memory cells may increase further than that of another memory cell in the program voltage apply operation (PGM Step). Further, the magnitude of a program voltage, used in any one of the plurality of program loops PLi to PLn, may be greater by a step voltage than that of a program voltage that is used in a program loop that is directly previous to the one program loop. The step voltage may be the difference between the magnitude of the program voltage that is used in the current program loop, among the plurality of program loops PL1 to PLn, and the magnitude of the program voltage that is used in the previous program loop. In an example, when the memory device 100 performs the verify operation (Verify Step) of the second program loop PL2 on the selected memory cells, the step voltage may be the difference between the magnitude of the program voltage that is used in the second program loop PL2 and the magnitude of the program voltage that is used in the first program loop PL1. In another example, the step voltage may be the unit voltage $\Delta$Vpgm, shown in FIG. 5.

The magnitude of the step voltage may be increased as the plurality of program loops PL1 to PLn are performed. As the plurality of program loops PL1 to PLn are performed, the magnitude of the step voltage may increase, and thus, the number of memory cells having threshold voltages that are greater than the verify voltage V_vfy may be increased. With the increase in the magnitude of the step voltage, the reference number of fail bits Ref fb, on which pass or fail is determined in the verify operation (Verify Step), may change. For example, as the magnitude of the step voltage increases, the reference number of fail bits Ref fb may increase.

Figure 7:
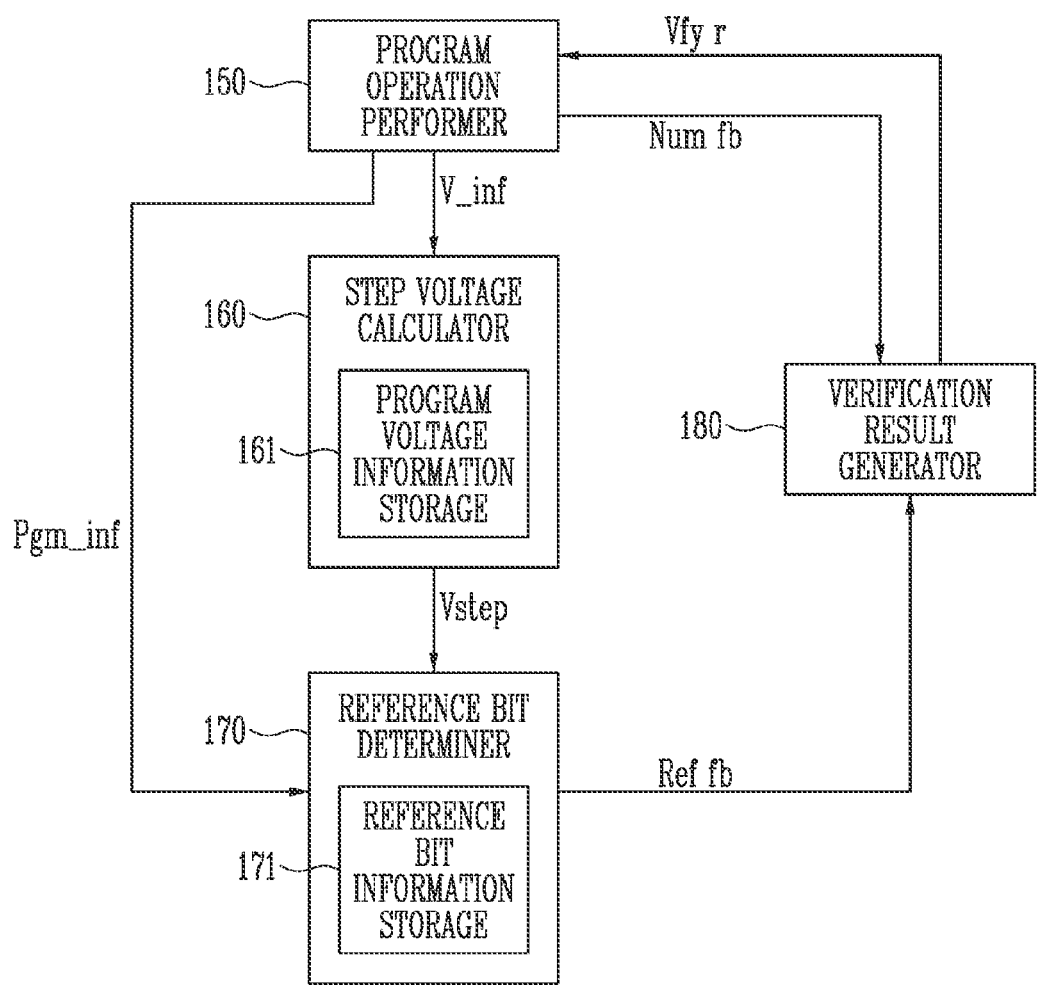
FIG. 7 is a diagram illustrating a program operation of a memory device according to an embodiment of the present disclosure.

FIG. 7 is a diagram illustrating a program operation of a memory device according to an embodiment of the present disclosure.

Referring to FIG. 7, the program operation controller 140 that is included in the memory device 100 may include a program operation performer 150, a step voltage calculator 160, a reference bit determiner 170, and a verification result generator 180.

The program operation performer 150 may be a circuit that performs a program operation on the plurality of memory cells that are selected from among a plurality of memory cells. The program operation may include a plurality of program loops. Each program loop may include a program voltage apply operation and a verify operation.

The program operation performer 150 may perform any one of the plurality of program loops and may provide program voltage information V_inf to the step voltage calculator 160 thereafter. The program voltage information V_inf may be information regarding the magnitude of a program voltage that is used in the one program loop, among the plurality of program loops. The program operation performer 150 may provide program-related information Pgm_inf to the reference bit determiner 170. The program-related information Pgm_inf may include the number of program and erase operations that are performed on the selected memory cells and information regarding the location of a selected word line that is coupled to the selected memory cells.

The program operation performer 150 may identify the threshold voltages of the selected memory cells by using a verify voltage. The program operation performer 150 may provide the number of memory cells Num fb, among the selected memory cells, identified as on-cells by using the verify voltage, to the verification result generator 180.

The step voltage calculator 160 may include a program voltage information storage 161.

The program voltage information storage 161 may store information regarding the magnitude of the program voltage that is used in the one program loop, among the plurality of program loops.

The step voltage calculator 160 may calculate a step voltage Vstep based on the information regarding the magnitude of the program voltage that is stored in the program voltage information storage 161. More specifically, the step voltage calculator 160 may calculate the step voltage Vstep, which is the difference between the magnitude of the program voltage that is used in any one program loop, among the plurality of program loops, and the magnitude of a program voltage that is used in a program loop that is directly previous to the one program loop. In other words, the step voltage Vstep may be a difference of magnitude between program voltages that are applied in any two consecutive program loops, among the plurality of program loops. For example, it is assumed that the program operation performer 150 performs a program voltage apply operation (PGM step) in a first program loop PL1 and a second program loop PL2 on the selected memory cells with reference to FIG. 5. Here, the step voltage calculator 160 may determine the difference between the magnitude of the second program voltage Vpgm2, applied to the selected memory cells in the second program loop PL2, and the magnitude of a first program voltage Vpgm1, applied to the selected memory cells in the first program loop PL1, to be the step voltage Vstep.

The magnitude of the step voltage Vstep may differ based on the extents to which the plurality of program loops are performed on the selected memory cells. In detail, the magnitude of the step voltage Vstep may increase based on the number of times that the plurality of program loops are performed. For example, referring to FIG. 5, the magnitude of the step voltage Vstep in the second program loop PL2, which is the difference between the magnitude of the second program voltage Vpgm2 and the magnitude of the first program voltage Vpgm1, may be less than the magnitude of the step voltage Vstep in the n-th program loop PLn, which is the difference between the magnitude of an n-th program voltage Vpgmn and the magnitude of an n−1-th program voltage Vpgmn−1.

The step voltage calculator 160 may provide the calculated step voltage Vstep to the reference bit determiner 170.

The reference bit determiner 170 may include a reference bit information storage 171.

The reference bit information storage 171 may store information regarding the reference number of fail bits. The information regarding the reference number of fail bits may include the first reference number of bits that corresponds to the magnitude of the step voltage Vstep, the second reference number of bits that corresponds to the number of program and erase operations that are performed on selected memory cells, and the third reference number of bits that corresponds to the location of the selected word line that is coupled to the selected memory cells.

The reference bit determiner 170 may be a circuit that determines the reference number of fail bits Ref fb based on the magnitude of the step voltage Vstep. The reference bit determiner 170 may receive the step voltage Vstep that is calculated by the step voltage calculator 160. In an embodiment, the reference bit determiner 170 may determine the first reference number of bits that corresponds to the magnitude of the step voltage Vstep to be the reference number of fail bits Ref fb by using the information regarding the reference number of fail bits that is stored in the reference bit information storage 171. The first reference number of bits may have a larger number of bits as the magnitude of the step voltage Vstep increases. In other embodiments, the reference bit determiner 170 may determine the sum of the first reference number of bits and the second reference number of bits that corresponds to the number of program and erase operations that are performed on the selected memory cells to be the reference number of fail bits Ref fb. The second reference number of bits may have a larger number of bits as the number of program and erase operations that are performed on the selected memory cells increases. In other embodiments, the reference bit determiner 170 may determine the sum of the first reference number of bits and the third reference number of bits that corresponds to the location of the selected word line that is coupled to the selected memory cells to be the reference number of fail bits Ref fb. The third reference number of bits may have a smaller number of bits as the location of the selected word line is closer to a select line. The select line may be a drain select line DSL or a source select line SSL, illustrated in FIG. 3. In other embodiments, the reference bit determiner 170 may determine the sum of the first reference number of bits, the second reference number of bits, and the third reference number of bits to be the reference number of fail bits Ref fb.

The reference bit determiner 170 may determine the reference number of fail bits Ref fb using the information regarding the reference number of fail bits that is stored in the reference bit information storage 171 and may provide the reference number of fail bits Ref fb to the verification result generator 180.

The verification result generator 180 may be a circuit that compares the number of memory cells Num fb that are identified as on-cells with the reference number of fail bits Ref fb and may generate verification result information Vfy r based on the result of the comparison. In detail, when the number of memory cells Num fb that are identified as on-cells is less than the reference number of fail bits Ref fb, the verification result generator 180 may generate verification result information Vfy r, indicating 'pass', and may provide the verification result information to the program operation performer 150. When the number of memory cells Num fb that are identified as on-cells is equal to or greater than the reference number of fail bits Ref fb, the verification result generator 180 may generate verification result information Vfy r, indicating 'fail', and may provide the verification result information to the program operation performer 150.

Thereafter, the program operation performer 150 may determine, based on the verification result information Vfy r that is provided from the verification result generator 180, whether a program loop subsequent to the one program loop is to be performed. In an example, when verification result information Vfy r, indicating 'pass', is received, the program operation performer 150 might not perform the subsequent program loop. In another example, when verification result information Vfy r, indicating 'pass', is received, the program operation performer 150 may skip a verify operation in the subsequent program loop. In other words, when verification result information Vfy r, indicating 'pass', is received, the program operation performer 150 may perform only a program voltage apply operation excluding a verify operation in the subsequent program loop. In a further example, when verification result information Vfy r, indicating 'fail', is received, the program operation performer 150 may perform the subsequent program loop.

FIG. 8 is a diagram illustrating a program voltage information storage.

Referring to FIG. 8, the program voltage information storage 161, included in the step voltage calculator 160, may store information regarding the magnitudes of program voltages. More specifically, the program voltage information storage 161 may store information regarding the magnitude of a first program voltage Vpgm1 that is used in a program voltage apply operation of a first program loop PL1. The program voltage information storage 161 may store information regarding the magnitudes of program voltages, ranging from a second program voltage Vpgm2 to an n-th program voltage Vpgmn, used in respective program voltage apply operations of respective program loops, ranging from a second program loop PL2 to an n-th program loop PLn. In this way, the program voltage information storage 161 may store the information regarding the magnitudes of the program voltages that are used in respective program voltage apply operations of the plurality of program loops. Also, the step voltage calculator 160, illustrated in FIG. 7, may calculate the step voltage based on the information regarding the program voltages that are stored in the program voltage information storage 161.

FIG. 9 is a diagram illustrating the first reference number of bits that corresponds to the magnitude of a step voltage.

Referring to FIG. 9, the reference bit information storage 171 may store the first reference number of bits that corresponds to the magnitude of the step voltage. Tables 1 and 2 of FIG. 9 show the first reference numbers of bits Ref fb1 and Ref fb11 that are to be determined based on the magnitudes of step voltages Vstep1 and Vstep2 that are calculated by the step voltage calculator 160, illustrated in FIG. 7. In an embodiment, referring to Table 1, when the magnitude of the step voltage Vstep1 is greater than 400 mV and less than or equal to 450 mV, the first reference number of bits Ref fb1 may be determined to be 50. That is, the first reference number of bits Ref fb1 that corresponds to the magnitude of the step voltage Vstep1 that is greater than 400 mV and less than or equal to 450 mV may be determined to be 50. Further, the first reference number of bits Ref fb1 that corresponds to the magnitude of the step voltage that is greater than 450 mV and less than or equal to 500 mV may be determined to be 50+a. The first reference number of bits Ref fb1 may be determined based on the range within which the magnitude of the step voltage Vstep1 falls. The first reference number of bits Ref fb1 that corresponds to the magnitude of the step voltage Vstep1 may be determined based on Table 1. Also, as shown in Table 1, as the magnitude of the step voltage Vstep1 increases, the first reference number of bits Ref fb1 may increase.

In an embodiment, referring to Table 2, the magnitude of the step voltage Vstep2 may regularly increase. In other words, the magnitude of the step voltage Vstep2 may increase according to a preset magnitude. In Table 2, the case in which the magnitude of the step voltage Vstep2 is increased by 50 mV is provided as an example. Referring to Table 2, when the magnitude of the step voltage Vstep2 is 400 mV, the first reference number of bits Ref fb11 may be determined to be 50. When the magnitude of the step voltage Vstep2 is 450 mV, the first reference number of bits Ref fb11 may be determined to be 50+a. In this way, the first is reference number of bits Ref fb11 that corresponds to the magnitude of the step voltage Vstep2 may be determined based on Table 2. Furthermore, as the magnitude of the step voltage Vstep2 increases, the first reference number of bits Ref fb11 may increase.

FIG. 10 is a diagram illustrating the second reference number of bits that corresponds to the number of program and erase operations.

Referring to FIG. 10, the reference bit information storage 171 may store the second reference number of bits Ref fb2 that corresponds to the number of program and erase operations E/W Cnt that are performed on selected memory cells. Referring to Table 3 illustrated in FIG. 10, when the number of program and erase operations E/W Cnt that are performed on selected memory cells is less than a first reference count value Ref Cnt1, the second reference number of bits Ref fb2 may be 0. When the number of program and erase operations E/W Cnt that are performed on selected memory cells is equal to or greater than the first reference count value Ref Cnt1 and less than a second reference count value Ref Cnt2, the second reference number of bits Ref fb2 may be b. When the number of program and erase operations E/W Cnt that are performed on selected memory cells is equal to or greater than the second reference count value Ref Cnt2 and less than a third reference count value Ref Cnt3, the second reference number of bits Ref fb2 may be 2b. As shown in Table 3, as the number of program and erase operations E/W Cnt performed on selected memory cells increases, the second reference number of bits Ref fb2 may increase.

FIG. 11 is a diagram illustrating the third reference number of is bits that corresponds to the location of a word line.

Referring to Table 4 in FIG. 11, the reference bit information storage 171 may store the third reference number of bits Ref fb3 that corresponds to the location of the selected word line that is coupled to selected memory cells. In a 3D memory cell structure, the characteristics of memory cells may differ based on the locations of the memory cells. In detail, as the memory cells are located closer to a central position, the characteristics of the memory cells may be better. As the memory cells are located closer to an edge, the characteristics of the memory cells may be worse.

In FIG. 11, it is assumed that, in the 3D memory cell structure, the plurality of memory cells that are coupled to an eighth word line WL8 are the plurality of memory cells that are located at the most central location. The plurality of memory cells that are coupled to the eighth word line WL8 may have better memory cell characteristics than those of other memory cells. That is, when a program voltage is applied to the eighth word line WL8, the extent to which the threshold voltages of the plurality of memory cells that are coupled to the eighth word line WL8 increase may be greater than the extent to which the threshold voltages of other memory cells increase. The plurality of memory cells that are coupled to the eighth word line WL8 may include more memory cells having threshold voltages that are greater than a verify voltage compared to other memory cells. Therefore, during a verify operation on the plurality of memory cells that are coupled to the eighth word line WL8, the third reference number of bits Ref fb3 may be higher than those of other memory cells. In FIG. 11, it is described that, when the selected word line is the eighth word line WL8, the corresponding third reference number of bits Ref fb3, which is 0, is the largest reference number of bits. The third reference number of bits Ref fb3 that corresponds to the eighth word line WL8 may be the largest. Further, as the selected word line is closer to the select line, the characteristics of the selected memory cells that are coupled to the selected word line are deteriorated, and thus, the third reference number of bits Ref fb3 may be low. For example, when the selected word line is a sixth word line WL6, the third reference number of bits Ref fb3 may be determined to be −2c. As the location of the selected word line is closer to the select line, the third reference number of bits Ref fb3 may decrease. That is, the third reference number of bits Ref fb3 that corresponds to the word line that is closest to the select line may have the smallest number of bits. That is, the third reference number of bits Ref fb3 that corresponds to the most central word line may have the largest number of bits, while the third reference number of bits Ref fb3 that corresponds to the word line that is closest to the select line may have the smallest number of bits. The select line may be a drain select line DSL or a source select line SSL, illustrated in FIG. 3.

FIG. 12 is a diagram illustrating the reference number of fail bits determined in consideration of the magnitude of a step voltage, the number of program and erase operations, and the location of a word line.

The reference bit determiner 170, illustrated in FIG. 7, may determine the reference number of fail bits based on information regarding the reference number of fail bits that is stored in the reference bit information storage 171. The information regarding the reference number of fail bits may include the first reference number of bits that corresponds to the magnitude of a step voltage, the second reference number of bits that corresponds to the number of program and erase operations that are performed on selected memory cells, and the third reference number of bits that corresponds to the location of a selected word line. That is, the reference number of fail bits may be determined in consideration of the magnitude of the step voltage, the number of program and erase operations, and the location of the selected word line.

The table, shown in FIG. 12, is described by way of example. When the magnitude of the step voltage is greater than 500 mV and less than or equal to 550 mV, the first reference number of bits may be set to 50+2a. When the number of program and erase operations that are performed on selected memory cells is equal to or greater than a first reference count value and less than a second reference count value, the second reference number of bits may be set to b. When the location of the selected word line corresponds to a seventh word line, the third reference number of bits may be set to −c. That is, the reference number of fail bits Ref fb may be set to 50+2a+b−c in consideration of all of the magnitude of the step voltage, the number of program and erase operations, and the location of the selected word line. The reference bit determiner 170 may provide the determined reference number of fail bits Ref fb to the verification result generator 180.

As described above with reference to FIGS. 9 to 11, the memory device 100 may determine the first reference number of bits based on the magnitude of the step voltage. The memory device 100 may determine the second reference number of bits based on the number of program and erase operations that are performed on selected memory cells. The memory device 100 may determine the third reference number of bits based on the location of the selected word line. The memory device 100 may determine the reference number of fail bits based on the first reference number of bits, the second reference number of bits, and the third reference number of bits. In detail, the memory device 100 may determine the sum of the first reference number of bits and at least one of the second reference number of bits and the third reference number of bits to be the reference number of fail bits.

In accordance with an embodiment of the present disclosure, the memory device 100 may reduce the number of times that a program voltage apply operation or a verify operation is performed by changing the reference number of fail bits based on the magnitude of the step voltage, the number of program and erase operations, and the location of the selected word line.

Figure 13:
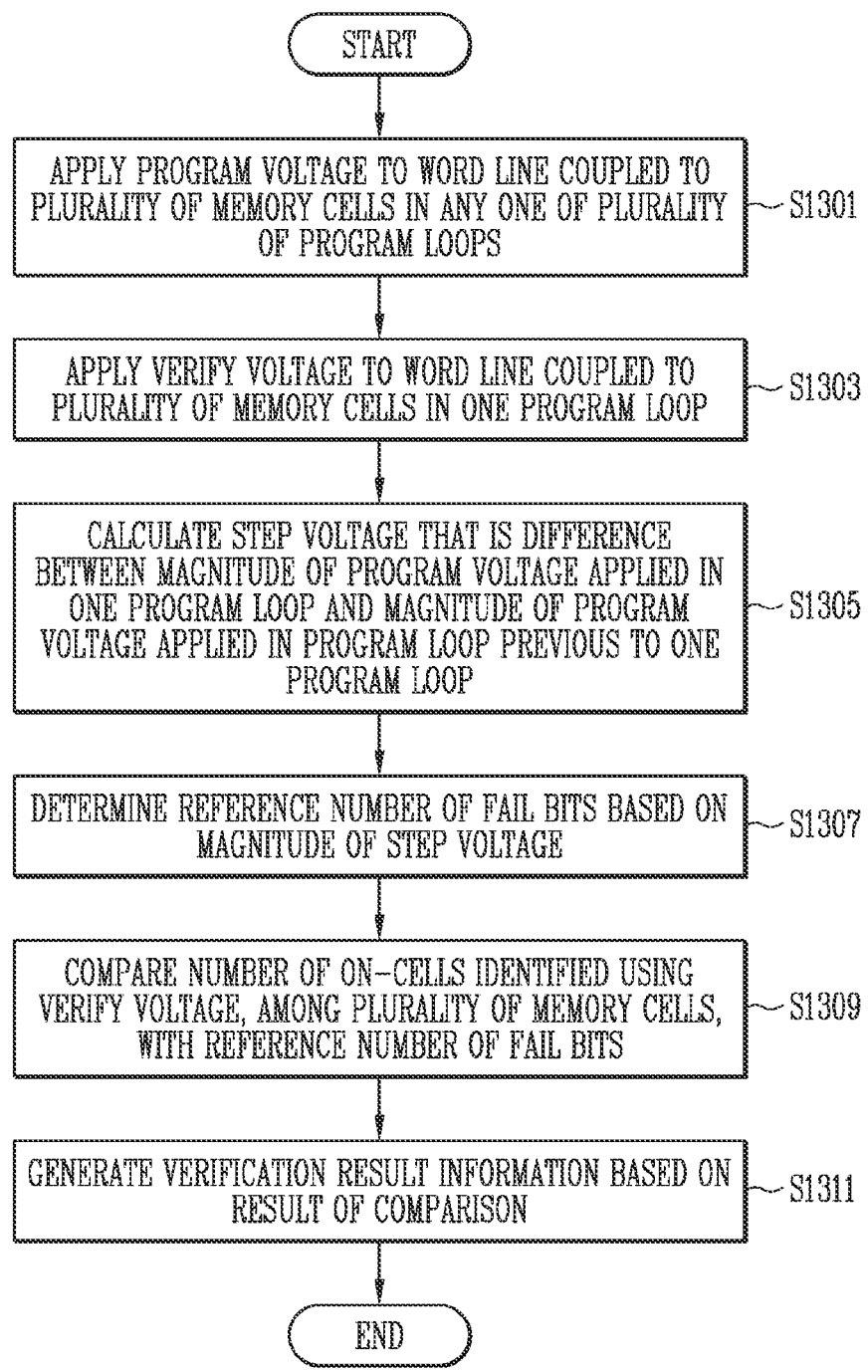
FIG. 13 is a flowchart illustrating a program operation of a memory device according to an embodiment of the present disclosure.

FIG. 13 is a flowchart illustrating a program operation of a memory device according to an embodiment of the present disclosure.

Referring to FIG. 13, at step S1301, the memory device 100 may apply a program voltage to a word line that is coupled to a plurality of memory cells in any one of a plurality of program loops.

At step S1303, the memory device 100 may apply a verify voltage to the word line that is coupled to the plurality of memory cells in the one program loop.

At step S1305, the memory device 100 may calculate a step voltage, which is the difference between the magnitude of the program voltage that is applied in the one program loop and the magnitude of a program voltage that is applied in a program loop that is directly previous to the one program loop.

At step S1307, the memory device 100 may determine the reference number of fail bits based on the magnitude of the step voltage. In an embodiment, the memory device 100 may determine the first reference number of bits that corresponds to the magnitude of the step voltage to be the reference number of fail bits. In detail, the magnitude of the step voltage Vstep may increase as the number of times that the plurality of program loops are performed increases. As the magnitude of the step voltage increases, the first reference number of bits may have a larger number of bits.

At step S1309, the memory device 100 may compare the number of on-cells, among the plurality of memory cells, identified by using the verify voltage, with the reference number of fail bits. The reference number of fail bits may include at least one of the first reference number of bits, the second reference number of bits, and the third reference number of bits.

At step S1311, the memory device 100 may generate verification result information based on the result of the comparison. In an example, the memory device 100 may generate verification result information, indicating 'pass', when the number of on-cells that are identified by using the verify voltage is less than the reference number of fail bits. In another example, the memory device 100 may generate verification result information, indicating 'fail', when the number of on-cells that are identified by using the verify voltage is equal to or greater than the reference number of fail bits.

Figure 14:
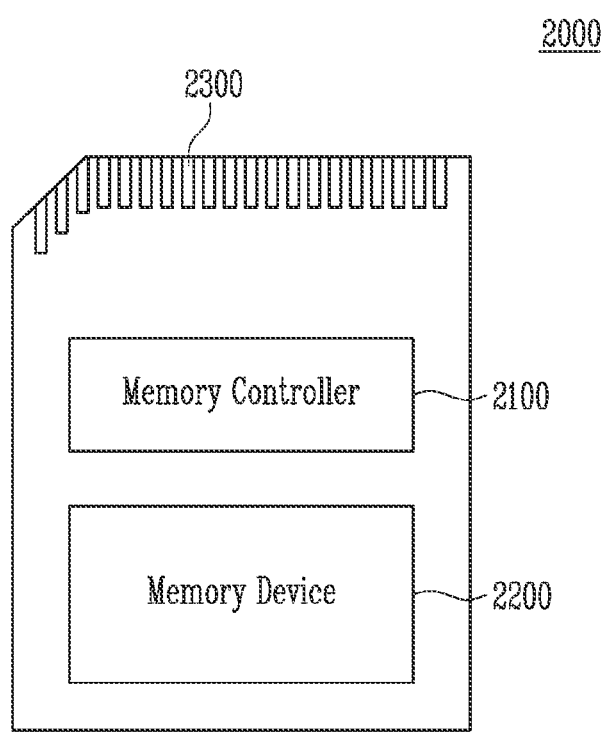
FIG. 14 is a block diagram illustrating a memory card system to which a memory system according to an embodiment of the present disclosure is applied.

FIG. 14 is a block diagram illustrating a memory card system to which a memory system according to an embodiment of the present disclosure is applied.

Referring to FIG. 14, a memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host) based on a specific communication standard or protocol. In an embodiment, the memory controller 2100 may communicate with the external device through at least one of various communication standards or protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe). In an embodiment, the connector 2300 may be defined by at least one of the above-described various communication standards or protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin Transfer Torque magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card, such as a PC card (personal computer memory card international association: PCMCIA), a compact flash (CF) card, a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 15:
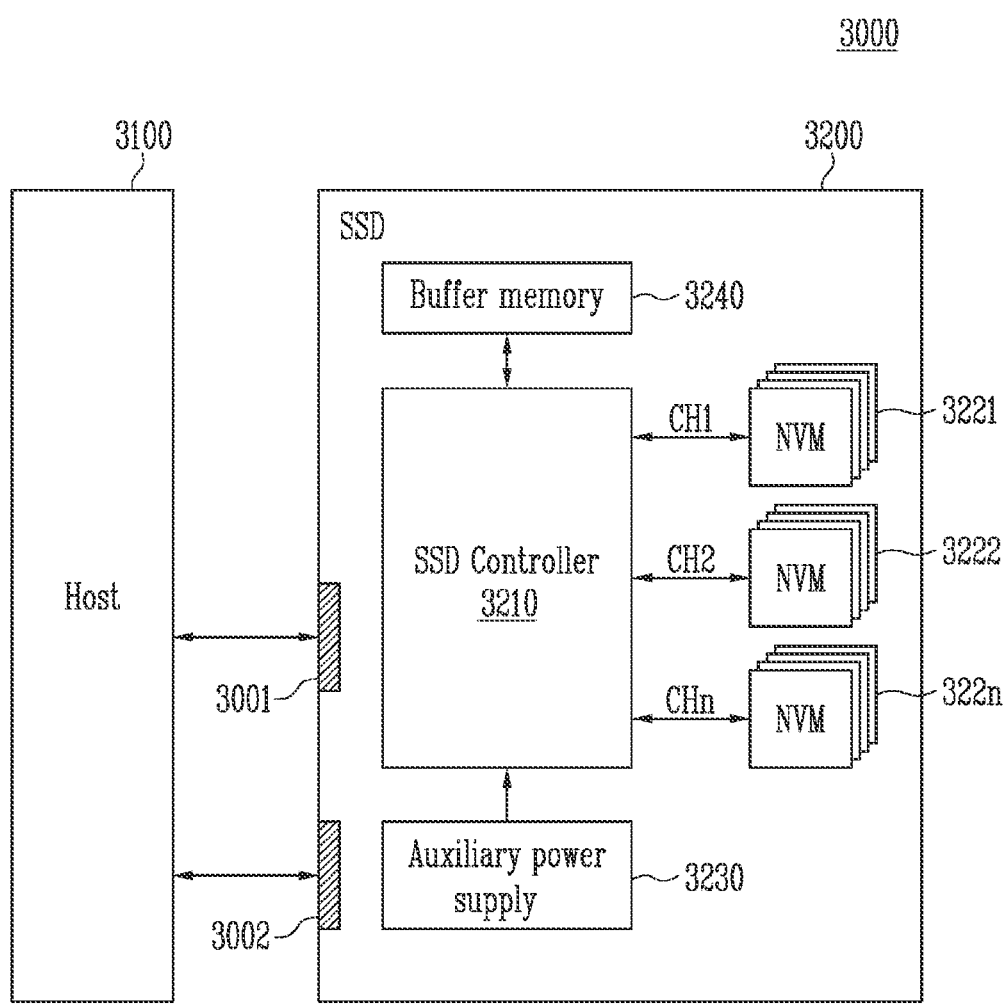
FIG. 15 is a block diagram illustrating a solid state drive (SSD) system to which a memory system according to an embodiment of the present disclosure is applied.

FIG. 15 is a block diagram illustrating a solid state drive (SSD) system to which a memory system according to an embodiment of the present disclosure is applied.

Referring to FIG. 15, an SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals that are received from the host 3100. In an embodiment, the signals may be signals based on the interfaces of the host 3100 and the SSD 3200. For example, the signals may be signals defined by at least one of various interfaces, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe).

The auxiliary power supply 3230 may be coupled to the host 3100 through the power connector 3002. The auxiliary power supply 3230 may be supplied with power from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside of the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data that is received from the host 3100 or data that is received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories, such as FRAM, ReRAM, STT-MRAM, and PRAM.

Figure 16:
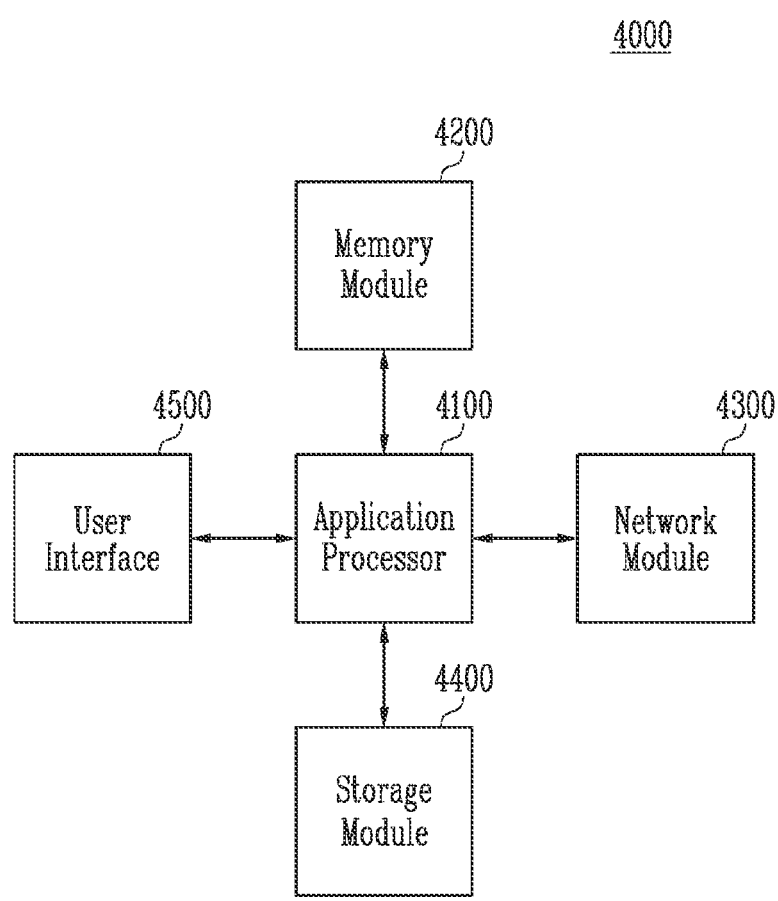
FIG. 16 is a block diagram illustrating a user system to which a memory system according to an embodiment of the present disclosure is applied.

FIG. 16 is a block diagram illustrating a user system to which a memory system according to an embodiment of the present disclosure is applied.

Referring to FIG. 16, a user system 4000 may include an application processor 4100, a memory module 4200, a network module 4300, a storage module 4400, and a user interface 4500.

The application processor 4100 may run components that are included in the user system 4000, an Operating System (OS), or a user program. In an embodiment, the application processor 4100 may include controllers, interfaces, graphic engines, etc. for controlling the components that are included in the user system 4000. The application processor 4100 may be provided as a system-on-chip (SoC).

The memory module 4200 may function as a main memory, a working memory, a buffer memory, or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs, such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data that is received from the application processor 4100. Alternatively, the storage module 4400 may transmit the data that is stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100, described above with reference to FIG. 1. The storage module 4400 may be operated in the same manner as the memory system 50 described above with reference to FIG. 1.

The user interface 4500 may include interfaces that input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device that can reduce the time required for a program operation and a method of operating the memory device.

What is claimed is:

1. A memory device, comprising:
    a plurality of memory cells;
    a program operation performer configured to perform a plurality of program loops on the plurality of memory cells;
    a step voltage calculator configured to calculate a step voltage, the step voltage being a difference of magnitude between program voltages that are applied in any two consecutive program loops, among the plurality of program loops;
    a reference bit determiner configured to determine a reference number of fail bits based on a magnitude of the step voltage; and
    a verification result generator configured to generate verification result information based on a result of a comparison between the reference number of fail bits and a number of on-cells, among the plurality of memory cells, identified in a verify operation that is included in a program loop, among the plurality of program loops,
    wherein the magnitude of the step voltage increases as a number of times that the plurality of program loops are performed increases.

2. The memory device according to claim 1, wherein:
    the reference bit determiner comprises a reference bit information storage configured to store information regarding the reference number of fail bits, and
    the information regarding the reference number of fail bits includes a first reference number of bits that corresponds to the magnitude of the step voltage, a second reference number of bits that corresponds to a number of program and erase operations that are performed on the plurality of memory cells, and a third reference number of bits that corresponds to a location of a word line that is coupled to the plurality of memory cells.

3. The memory device according to claim 2, wherein the reference bit determiner is configured to determine the first reference number of bits to be the reference number of fail bits.

4. The memory device according to claim 2, wherein the first reference number of bits has a larger number of bits as the magnitude of the step voltage increases.

5. The memory device according to claim 2, wherein the second reference number of bits has a larger number of bits as the number of program and erase operations that are performed on the plurality of memory cells increases.

6. The memory device according to claim 2, wherein the third reference number of bits has a smaller number of bits as the word line is closer to a select line.

7. The memory device according to claim 2, wherein the reference bit determiner is configured to determine a sum of the first reference number of bits and at least one of the second reference number of bits and the third reference number of bits to be the reference number of fail bits.

8. The memory device according to claim 1, wherein the verification result generator is configured to:
    generate verification result information indicating a pass in the verify operation when the number of on-cells is less than the reference number of fail bits;
    generate verification result information indicating a fail in the verify operation when the number of on-cells is equal to or greater than the reference number of fail bits; and
    provide the verification result information to the program operation performer.

9. The memory device according to claim 8, wherein the program operation performer is configured to, when the verification result information indicating a pass in the verify operation is received, perform a program loop that is subsequent to the program loop, among the plurality of program loops, such that the verify operation is excluded in the subsequent program loop.

10. A method of operating a memory device including plurality of memory cells, comprising:
    performing a plurality of program loops on the plurality of memory cells;
    calculating a step voltage, the step voltage being a difference of magnitude between program voltages that are applied in any two consecutive program loops, among the plurality of program loops;
    determining a reference number of fail bits based on a magnitude of the step voltage; and
    generating verification result information based on a result of a comparison between the reference number of fail bits and a number of on-cells, among the plurality of memory cells, identified in a verify operation that is included in a program loop, among the plurality of program loops,
    wherein the magnitude of the step voltage increases as a number of times that the plurality of program loops are performed increases.

11. The method according to claim 10, wherein the reference number of fail bits is determined to be a first reference number of bits that corresponds to the magnitude of the step voltage.

12. The method according to claim 11, wherein the first reference number of bits has a larger number of bits as the magnitude of the step voltage increases.

13. The method according to claim 11, wherein the reference number of fail bits is determined to be a sum of the first reference number of bits and a second reference number of bits that corresponds to a number of program and erase operations that are performed on the plurality of memory cells.

14. The method according to claim 13, wherein the second reference number of bits has a larger number of bits as the number of program and erase operations that are performed on the plurality of memory cells increases.

15. The method according to claim 11, wherein the reference number of fail bits is determined to be a sum of the first reference number of bits and a third reference number of bits that corresponds to a location of a word line that is coupled to the plurality of memory cells.

16. The method according to claim 15, wherein the third reference number of bits has a smaller number of bits as the word line is closer to a select line.

17. A memory device, comprising:
a plurality of memory cells;
a program operation performer configured to perform a plurality of program loops on the plurality of memory cells; and
a verification result generator configured to generate verification result information based on a result of comparing a reference number of fail bits to a number of on-cells, among the plurality of memory cells, identified in a verify operation that is included in each of the plurality of program loops,
wherein a magnitude of a program voltage that is used in each of the plurality of program loops increases by a step voltage for each subsequent program loop, among the plurality of program loops,
wherein the reference number of fail bits has a larger number of bits as a magnitude of the step voltage increases, and
wherein the magnitude of the step voltage increases as a number of times that the plurality of program loops are performed increases.

18. The memory device according to claim 17, wherein the reference number of fail bits has a larger number of bits as a number of program and erase operations that are performed on the plurality of memory cells increases and has a smaller number of bits when a word line that is coupled to the plurality of memory cells is closer to a select line.

* * * * *